United States Patent
Jordan

(10) Patent No.: US 6,556,075 B1
(45) Date of Patent: Apr. 29, 2003

(54) AMPLIFIER SYSTEM AND METHOD THAT APPROXIMATE CONSTANT IMPEDANCE AND QUIESCENT OUTPUTS DURING FORWARD AND REVERSE MODES

(75) Inventor: Edward Perry Jordan, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/939,437

(22) Filed: Aug. 24, 2001

(51) Int. Cl.[7] .................................................. H03F 1/14
(52) U.S. Cl. .......................... 330/51; 330/57; 330/86; 330/144
(58) Field of Search ........................... 330/51, 86, 144, 330/57

(56) References Cited

U.S. PATENT DOCUMENTS

| | | | | |
|---|---|---|---|---|
| 4,394,542 A | * | 7/1983 | Hara et al. ................... 379/394 |
| 4,608,462 A | * | 8/1986 | Blomley et al. ......... 379/395.01 |
| 5,182,527 A | * | 1/1993 | Nakanishi et al. ........... 330/285 |
| 5,442,321 A | | 8/1995 | Bayruns et al. .............. 330/283 |
| 5,574,992 A | * | 11/1996 | Cygan et al. ................ 455/126 |
| 5,742,204 A | * | 4/1998 | Bell ............................. 330/258 |
| 5,880,631 A | * | 3/1999 | Sahota ........................... 330/51 |
| 6,040,732 A | * | 3/2000 | Brokaw ....................... 327/408 |
| 6,313,682 B1 | * | 11/2001 | Muller et al. ................ 327/291 |

OTHER PUBLICATIONS

"Maxim Upstream CATV Amplifier", MAX3510 data sheet, Maxim Integrated Products, Sunnyvale, California.
"CATV Reverse Amp W/Step Attenuator", Application Note, Anadigics, Inc., Warren, New Jersey.

* cited by examiner

Primary Examiner—Michael Tokar
Assistant Examiner—Linh V Nguyen
(74) Attorney, Agent, or Firm—Koppel, Jacobs, Patrick & Heybl

(57) ABSTRACT

Amplifier systems and methods are provided which closely approximate a constant output impedance and a constant quiescent output signal during forward and reverse modes of operation. The systems can be realized with small, inexpensive components that are compatible with integrated-circuit fabrication processes. A system embodiment includes a signal amplifier, a feedback path that is coupled across at least part of the signal amplifier to reduce its impedance, a reverse amplifier which is coupled to drive at least a feedback portion of the feedback path and a signal generator which controls operational timing of the signal amplifier and reverse amplifier. Another system embodiment includes an error-current canceler that cancels error currents of the signal amplifier with substantially equal and opposite correction currents.

28 Claims, 6 Drawing Sheets

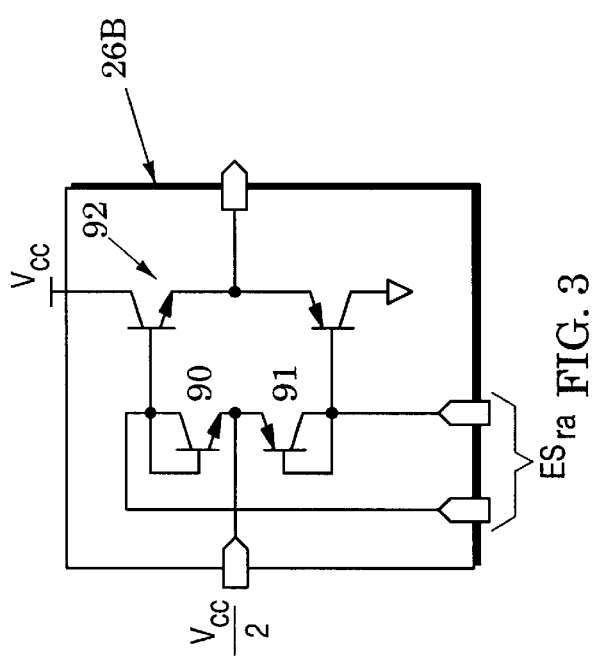
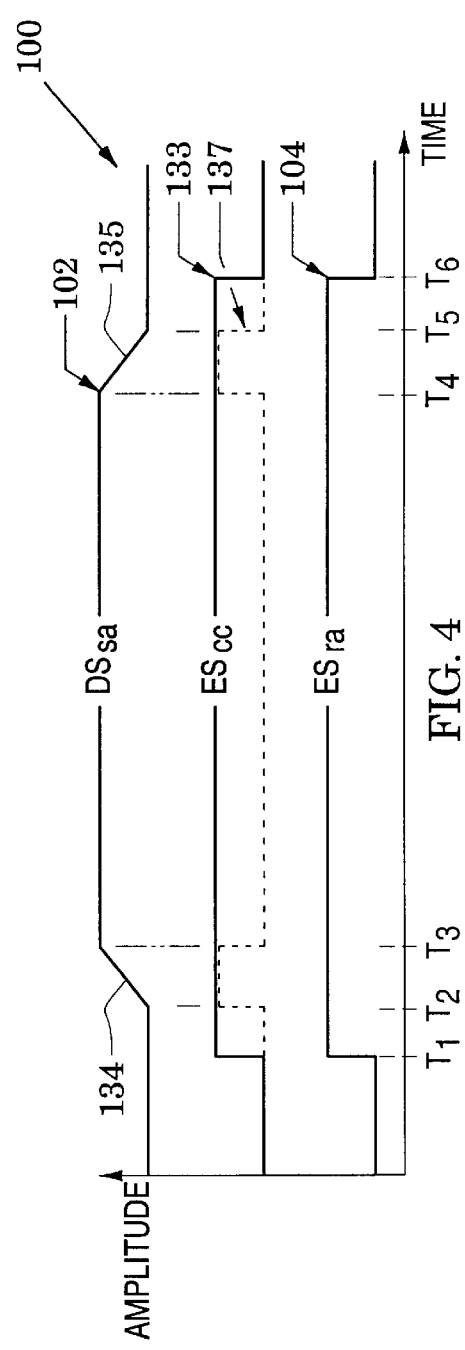

AMPLIFIER SYSTEM AND METHOD THAT APPROXIMATE CONSTANT IMPEDANCE AND QUIESCENT OUTPUTS DURING FORWARD AND REVERSE MODES

BACKGROUND OF THE INVENTION

1. Field of the Invention

The present invention relates generally to amplifier systems that operate in forward and reverse modes.

2. Description of the Related Art

Gain programmable power amplifiers are essential in a variety of modern communication systems. In cable modem systems, for example, communication signals are transmitted "downstream" from a cable headend for reception by system subscribers and data signals are transmitted "upstream" from the subscribers. The downstream signals are generally transmitted in one frequency band (e.g., 45–800 MHz) and the upstream signals in a different frequency band (e.g., 5–43 MHz).

When transmitting data signals upstream in a "forward" transmit operational mode, an upstream amplifier preferably operates with minimal signal distortion, suppresses generation of transient signals, and provides an output impedance $Z_{out}$ that closely matches a cable impedance (e.g., 75 ohms). In order to avoid avoid degradation of a corresponding downstream amplifier, the upstream amplifier preferably continues to provide the output impedance $Z_{out}$ in a "reverse" power-down operational mode.

Conventional power amplifiers have typically attempted to meet these demanding requirements with amplifier structures (e.g., transformers and field-effect transistor (FET) switches) that impose significant cost and volume penalties and/or are not compatible with other integrated-circuit fabrication processes.

BRIEF SUMMARY OF THE INVENTION

The present invention is directed to amplifier systems and methods which closely approximate a constant output impedance and a constant quiescent output signal during forward and reverse modes of operation. These goals are realized with small, inexpensive components that are compatible with integrated-circuit fabrication processes.

In a system embodiment, a signal amplifier transitions from an enable state to a disable state in response to a signal-amplifier disable signal $DS_{sa}$, a feedback path is coupled to the signal amplifier to reduce its impedance to a substantially lower enable state output impedance and a reverse amplifier transitions to an on state in response to a reverse-amplifier enable signal $ES_{ra}$ and is coupled to the feedback path.

The reverse amplifier thus interrupts the feedback path to thereby replace the enable state output impedance with the signal amplifier's higher impedance and forms, with the feedback portion, a disable state output impedance that approximates the enable state output impedance. A signal generator provides the signal-amplifier disable signal $D_{sa}$ and the reverse-amplifier enable signal $ES_{ra}$ with the reverse-amplifier enable signal $ES_{ra}$ initiated before the signal-amplifier disable signal $DS_{sa}$ and terminated after the signal-amplifier disable signal $DS_{sa}$.

Another system embodiment includes an error-current canceler that comprises a current sensor which generates a sense signal in response to an error current $I_{err}$ that is generated by the signal amplifier as it transitions between its enable and disable states and further comprises a correction-current generator that responds to the sense signal by canceling the error current $I_{err}$ with a substantially equal and opposite correction current $I_{crctn}$.

The novel features of the invention are set forth with particularity in the appended claims. The invention will be best understood from the following description when read in conjunction with the accompanying drawings.

BRIEF DESCRIPTION OF THE DRAWINGS

FIG. 3 is a schematic of a reverse amplifier embodiment in the amplifier systems of FIGS. 1 and 2;

FIG. 4 is a timing diagram that illustrates timed operation of a signal amplifier, a reverse amplifier and an error-current canceler in the amplifier systems of FIGS. 1 and 2;

DETAILED DESCRIPTION OF THE INVENTION

Figure 1:
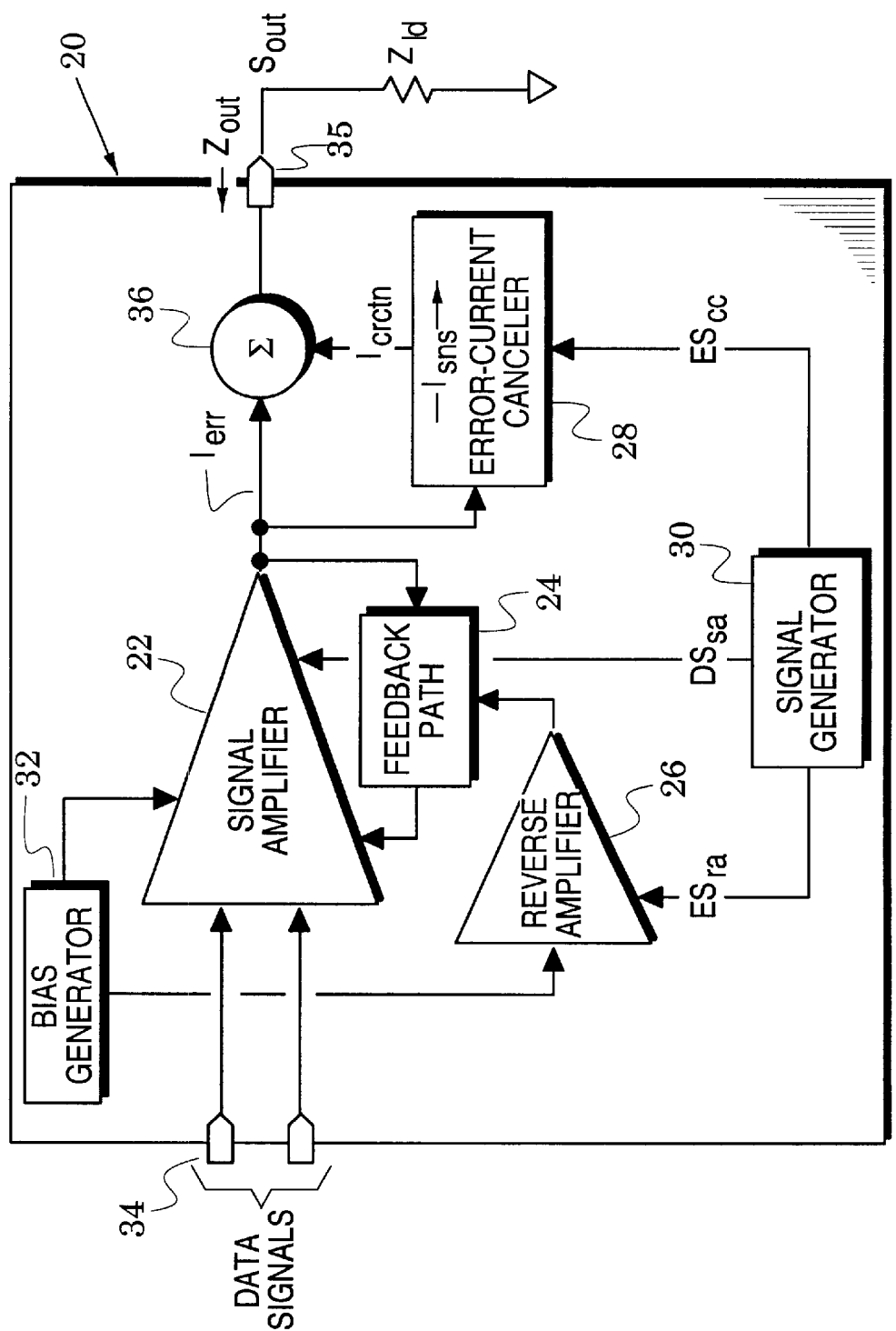
FIG. 1 is a block diagram of an amplifier system of the present invention which approximates a constant output impedance and a constant quiescent output signal during forward and reverse operational modes.

FIG. 1 illustrates an amplifier system 20 of the present invention which closely approximates a constant output impedance $Z_{out}$ ($Z_{out}$ is indicated in FIG. 1) and a constant quiescent output signal during forward and reverse modes of operation. The constant output impedance $Z_{out}$ satisfies operational requirements of various communication systems (e.g., cable, modem systems) and insures that corresponding circuits (e.g., an downstream amplifier) will not be operationally degraded.

A quiescent state is a state in which transmitted signals (e.g., data signals) are absent in the amplifier system 20. The amplifier system 20 provides a constant output signal during these quiescent states so that transient signals are substantially reduced at its output. Finally, the amplifier system 20 achieves these advantages with circuit elements that can be included within integrated circuits and are compatible with conventional integrated-circuit fabrication processes.

Figure 2:
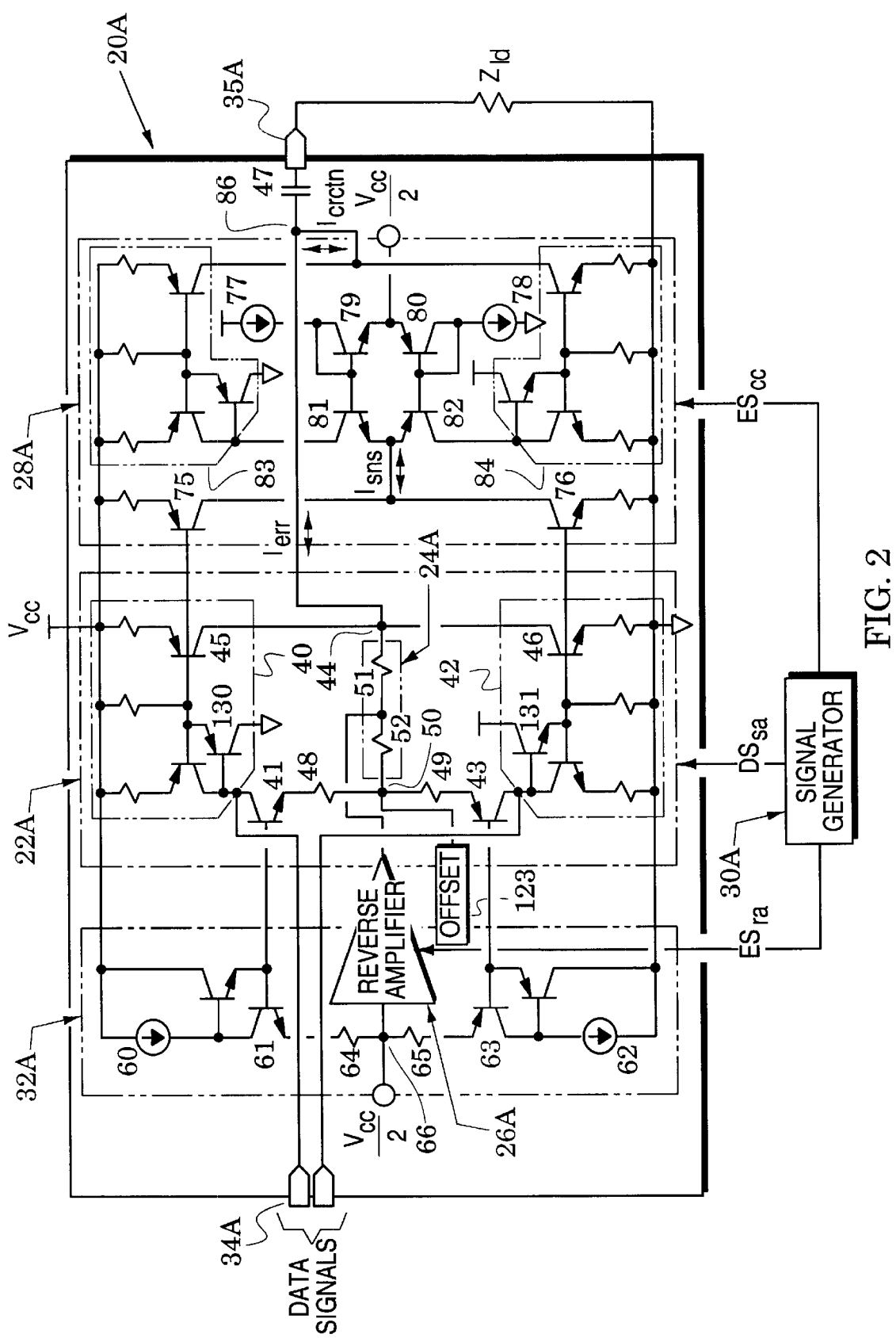
FIG. 2 is a schematic of another embodiment of the amplifier system of FIG. 1.
Figure 5:
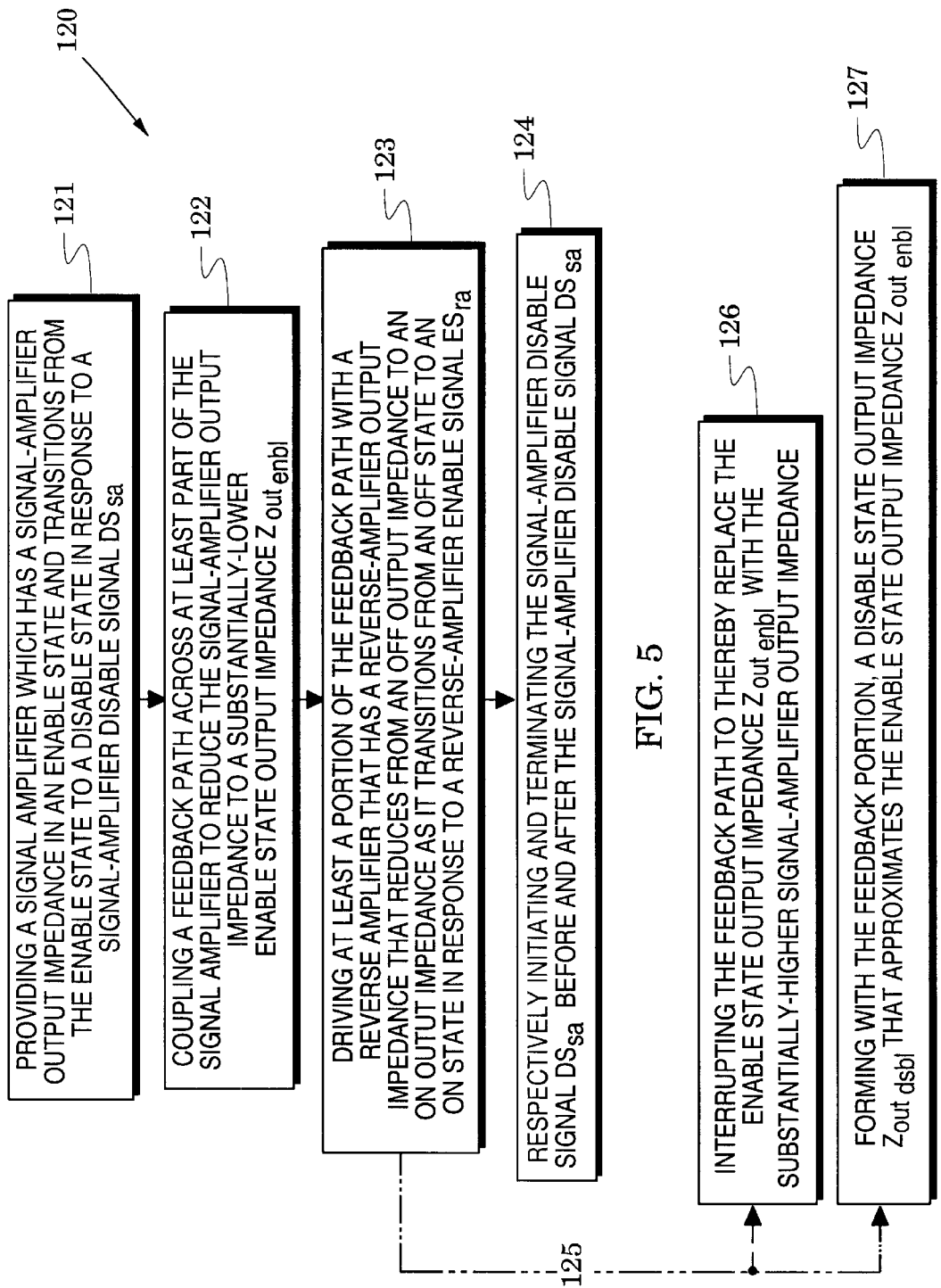
FIG. 5 is a flow chart that illustrates operational processes in the amplifier systems of FIGS. 1, 2 and 3.

FIGS. 2 and 3 respectively illustrate other amplifier system embodiments and FIGS. 4 and 5 respectively illustrate operational timing and operational processes of the amplifier systems. An understanding of an investigation of these operational processes will be enhanced by preceding it with the following description of FIGS. 1–3.

The amplifier system 20 of FIG. 1 includes a signal amplifier 22, a feedback path 24, a reverse amplifier 26, an error-current canceler 28, a signal generator 30 and a bias generator 32. In a forward operational mode, the signal amplifier 22 is enabled to respond to data signals at an input port such as the differential input port 34 by providing output data signals at a single-ended output port 35 which is coupled to drive a load impedance $Z_{ld}$ (e.g., the 75 ohm load impedance of a transmission cable).

The signal amplifier 22 has a signal-amplifier output impedance that is significantly lowered during its enable state by the feedback path 24 to an enable state output impedance $Z_{out_{enbl}}$ that substantially matches the load impedance $Z_{ld}$. The signal amplifier also has a disable state during which it must not degrade corresponding amplifier systems (e.g., an upstream amplifier) that are coupled to the load impedance $Z_{ld}$. The signal amplifier 22 transitions from its enable state to its disable state in response to a signal-amplifier disable signal $DS_{sa}$ that is provided by the signal generator 30.

The reverse amplifier 26 has a reverse-amplifier output impedance that reduces from a high output impedance to a substantially lower on output impedance as it transitions from an off state to an on state in response to a reverse-amplifier enable signal $ES_{ra}$ that is provided by the signal generator 30. The reverse amplifier 24 is coupled to the feedback path 24 (e.g., coupled to drive at least a portion of the path) so that it a) interrupts the feedback path in the on state and, accordingly, replaces the enable state output impedance $Z_{out_{enbl}}$ at output port 35 with the substantially higher signal-amplifier output impedance, and b) forms with the feedback-path portion a disable state output impedance $Z_{out_{dsbl}}$ at approximates (i.e., preferably equals) the enable state output impedance $Z_{out_{enbl}}$.

Because of inevitable circuit imbalances, the signal amplifier 22 typically generates an error current $I_{err}$ at its output as it transitions between its enable and disable states. In response to the error current $I_{err}$ of the signal amplifier 22, the error-current canceler 28 generates a sense current $I_{sns}$ (shown within the error-current canceler in FIG. 1) and, in response to this sense current, provides a correction current $I_{crctn}$ that is substantially equal and opposite to the error current $I_{err}$. The error current $I_{err}$ and correction current $I_{crctn}$ are summed at a summer 36. Accordingly, a constant quiescent output signal is maintained at the output port 35 during transitions of the signal amplifier 22 between its enable and disable states.

The error-current canceler 28 is enabled by a error-current canceler enable signal $ES_{cc}$ that is provided by the signal generator 30. The signal generator 30 also provides the signal-amplifier disable signal $DS_{sa}$ and the reverse-amplifier enable signal $ES_{ra}$ and arranges the timing of the signal-amplifier disable signal $DS_{sa}$, the reverse-amplifier enable signal $ES_{ra}$ and the error-current canceler enble signal $ES_{cc}$ so that a substantially-constant output impedance and a substantially-constant quiescent output signal are provided at the output port 35.

FIG. 2 illustrates another amplifier system embodiment 20A which includes a signal amplier 22A, a feedback path 24A, a reverse amplifier 26A, an error-current canceler 28A, a signal generator 30A, a bias generator 32A, an input port 34A and a single-ended output port 35A.

The signal amplifier 22A has upper and lower current mirrors 40 and 42 which receive bias currents from respective cascode transistors 41 and 43 and mirror these into output bias currents which combine at node 44. Output transistors 45 and 46 of the current mirrors 40 and 42 are arranged as a complementary transistor output stage (in particular, a complementary common-emitter output stage) that, when driven by an alternating current (ac) signal, drives the node 44 and the resultant ac output currents are passed through a coupling capacitor 47 (adjacent the output port 35A) to the load impedance $Z_{1d}$.

The cascode transistors 41 and 43 are coupled together by coupling resistors 48 and 49 which connect to node 50 and the feedback path 24A comprises serially-connected resistors 51 and 52 that feed current back from the node 44 at the signal amplifier output to the node 50. When the signal amplifier is enabled for data transmission, it receives data differential current signals from the input port 34A and mirrors them with upper and lower current mirrors 40 and 42 into output signals across the load impedance $Z_{ld}$.

The complementary common-emitter output stage (output transistors 45 and 46) forms a high output impedance signal-amplifier but, when the signal amplifier is enabled, the output impedance is reduced to approximately $R_{fdb}/(1+A)$ wherein $R_{fdb}$ is the sum of the resistances of feedback resistors 51 and 52 and A is the gain of the current mirrors 40 and 42.

The bias generator 32A includes diode-coupled bias transistors 61 and 63 coupled between current sources 60 and 62. The bias transistors are coupled together with bias resistors 64 and 65 which meet at a node 66 that receives a bias voltage (e.g., ½ that of the signal amplifier's bias voltage $V_{cc}$). The bias transistors 61 and 63 are base coupled to the cascode transistors 41 and 43 so that the cascode transistors mirror the bias currents in the bias transistors (or a scaling factor of the bias currents) and, accordingly, the signal amplifier node 50 has a nominal bias substantially equal that of the node 66. The reverse amplifier 26A is biased from the node 66 and is coupled to drive the node between the feedback resistors 51 and 52.

The error-current canceler 28A has sense transistors 75 and 76 that mirror current in output transistors 45 and 46 of the signal amplifier 22A to thereby generate a sense current $I_{sns}$ that corresponds to an error current $I_{err}$ (or a scaling factor of the error current) out of the signal amplifier's node 44. Current sources 77 and 78 and diode-coupled transistors 79 and 80 generate an idling current which is mirrored by steering transistors 81 and 82 which respectively drive correction current mirrors 83 and 84. Outputs of the correction current mirrors are connected to a node 86 that couples to the coupling capacitor 47. The sense current $I_{sns}$ adds or subtracts from the idling current and is thus steered via the correction current mirrors which mirror the sense current $I_{sns}$ into a correction current $I_{crctn}$ that cancels the error current $I_{err}$ at the node 86.

The signal generator 30A provides the reverse-amplifier enable signal $ES_{ra}$, the signal-amplifier disable signal $DS_{sa}$, and the error-current canceler enable signal $ES_{cc}$ respectively to the reverse amplifier 26A, the signal amplifier 22A and the error-current canceler 28A.

The signal-amplifier disable signal $DS_{sa}$ can be realized with any of various conventional circuits and in FIG. 2, it, for example, alters the base levels of cascode transistors 41 and 43 to thereby turn off the upper and lower current mirrors 40 and 42 of the signal amplifier. Preferably, the disable signal is arranged to clamp the bases of transistors 130 and 131 at levels that are sufficient to keep them on but are not sufficient to turn on complementary output transistors 45 and 46. This clamping enhances the turnon speed of the upper and lower current mirrors.

The error-current canceler enable signal $ES_{cc}$ can be realized with any signal that turns on the correction current mirrors 83 and 84 and turns them off in absence of the enable signal $ES_{cc}$. In this absence, the correction current mirrors 83 and 84 are preferably clamped in a manner just described for the upper and lower current mirrors 40 and 42.

FIG. 3 shows a reverse amplifier embodiment 26B which comprises a pair of diode-coupled transistors 90 and 91 that receive the reverse-amplifier enable signal $ES_{ra}$ from the signal generator (30A in FIG. 2) and a complementary transistor output stage 92 (in particular, a complementary common-collector output stage) whose output impedance is the reverse-amplifier output impedance.

In response to the reverse-amplifier enable signal $ES_{ra}$, current through transistors 90 and 91 bias on the complementary common-collector output stage so that the reverse-amplifier output impedance reduces to an on output impedance that, when combined with feedback resistor 51 of FIG. 2, closely approximates the load impedance $Z_{ld}$ of FIG. 2. In the on state, the complementary transistor output stage 92 provides the same $V_{cc/2}$ signal that biases transistors 90 and 91. In absence of reverse-amplifier enable signal $ES_{ra}$, transistors 90 and 91 do not turn on the complementary transistor output stage 92 and the reverse-amplifier output impedance increases to an significantly higher off output impedance.

Attention is now directed to an operational description of the amplifier system structures of FIGS. 1–3 which is enhanced with the timing diagram 100 of FIG. 4 and the flow chart 120 of FIG. 5. The first step 121 of FIG. 5 provides a signal amplifier (22A in FIG. 2) which has a signal-amplifier output impedance in an enable state and transitions from the enable state to a disable state in response to the signal-amplifier disable signal $DS_{sa}$ 102 of FIG. 4. The second step 122 couples a feedback path (24A in FIG. 2) across the signal amplifier, (or at least part of the signal amplifier) to reduce the signal-amplifier output impedance to a substantially lower enable state output impedance $Z_{out_{enbl}}$.

Prior to time $T_1$ in FIG. 4, the signal amplifier is thus available for providing output data signals at an output port (35A in FIG. 2) in response to input data signals at an input port (34A in FIG. 2). During this active operational mode, the signal amplifier's output impedance is set by the feedback path to an enable state output impedance $Z_{out_{enbl}}$ that matches the load impedance $Z_{ld}$ (in FIG. 2).

The signal amplifier is preferably off when the reverse amplifier is enabled to eliminate a significant source of noise signals at the output port 35A of FIG. 2 and to reduce overall current drain of the amplifier system. Although data signals are not expected during the subsequent reverse mode, this also insures that noise signals at the input port 34A will be suppressed.

It is noted that the biasing of the bias generator 32A of FIG. 2 couples through cascode transistors 41 and 43 and coupling resistors 48 and 49 to hold node 44 at a quiescent level (e.g., $V_{cc}/2$). The reverse amplifier embodiment 26B of FIG. 3 shows that the reverse amplifier will also provide a quiescent level (e.g., $V_{cc}/2$) at its output. If necessary, an offset circuit 123 of FIG. 2 provides or removes current from node 50 of the signal amplifier 22A to realize a match between the quiescent levels of the signal amplifier and the reverse amplifier. Typically, this offset current is on in the forward mode and off in the reverse mode.

Process step 123 of FIG. 5 drives at least a portion (resistor 51 in FIG. 2) of the feedback path (24A in FIG. 2) with a reverse amplifier (26A in FIG. 2) which has a reverse-amplifier output impedance that reduces from a high output impedance to a substantially lower on output impedance as it transitions from an off state to an on state in response to the reverse-amplifier enable signal $ES_{ra}$ 104 of FIG. 4.

Finally, process step 124 of FIG. 5 respectively initiates and terminates the reverse-amplifier enable signal $ES_{ra}$ before and after the signal-amplifier disable signal $DS_{sa}$. This signal relationship is illustrated in FIG. 4 where the reverse-amplifier enable signal $ES_{ra}$ is initiated at time $T_1$ and the signal-amplifier disable signal $DS_{sa}$ ramps on between later times $T_2$ and $T_3$. The signal-amplifier disable signal $D_{sa}$ subsequently ramps off between times $T_4$ and $T_5$ and the reverse-amplifier enable signal $ES_{ra}$ is terminated at a later time $T_6$.

Path 125 of FIG. 5 indicates that the driving step 123 inherently interrupts the feedback path (24A in FIG. 2) during the reverse amplifier's on state and thereby replaces the enable state output impedance $Z_{out_{enbl}}$ with the substantially higher signal-amplifier output impedance as recited in step 126 and inherently forms, with the portion (resistor 51 in FIG. 2), a disable state output impedance $Z_{out_{dsbl}}$ that approximates the enable state output impedance $Z_{out_{enbl}}$ as recited in step 127.

At time $T_1$ in FIG. 4, the reverse-amplifier enable signal $ES_{ra}$ 104 causes the output impedance of the signal amplifier 22A of FIG. 2 to jump to a significantly higher signal-amplifier output impedance (supplied by the high impedance collectors of transistors 45 and 46) because its feedback path has been broken by the reverse amplifier which establishes a voltage signal (e.g., $V_{cc}/2$) at the junction between feedback resistors 51 and 52. The output impedance of the signal amplifier thus has little effect on the output impedance at node 44 because this is essentially set by the combination of the reverse amplifier's on output impedance (initiated at time $T_1$) and the impedance of the feedback resistor 51 and this combination is the disable state output impedance $Z_{out_{dsbl}}$ which closely approximates the enable state output impedance $Z_{out_{enbl}}$.

After time $T_5$ in FIG. 4, the signal amplifier is on but its high signal-amplifier output impedance has little effect on the output impedance. At time $T_6$, the reverse amplifier is turned off which simultaneously increases its output impedance to its substantially higher off output impedance and permits the feedback path to reduce the signal amplifier's output impedance to the enable state output impedance $Z_{out_{enbl}}$.

As the upper and lower current mirrors 40 and 42 of the signal amplifier 22A of FIG. 2 are turned on and off, they tend to generate an output error current (e.g., $I_{err}$ at node 44 in FIG. 2) because their transistors are of opposite polarity (e.g., complementary output transistors 45 and 46) and have different operational parameters (e.g., different Early voltages). If not corrected, the output error current $I_{err}$ will generate output transient signals as it flows through the load impedance $Z_{ld}$.

Accordingly, the error-current canceler 28A of FIG. 2 is enabled to generate a sense signal $I_{sns}$ in response to the output error current $I_{err}$. In response to the sense signal, it then cancels the output error current $I_{err}$ with a substantially equal and opposite correction current signal $I_{crctn}$ at node 86. As previously described, an idling current passes through steering transistors 81 and 82 and is oppositely mirrored to node 86 by correction current mirrors 83 and 84 so that the correction current $I_{crctn}$ is zero in the absence of an error current $I_{err}$.

When the complementary output transistors 45 and 46 of the signal amplifier generate an error current $I_{err}$, the mirror transistors 75 and 76 generate a corresponding sense current $I_{sns}$ which is steered by steering transistors 81 and 82 to the correction current mirrors 83 and 84. The correction current mirrors then mirror the correction current signal $I_{crctn}$ to the summing node 86.

To reduce current drain, the mirror ratio of the sense transistors (75 and 76 in FIG. 2) is preferably selected so that the amplitude of the sense current $I_{sns}$ is some fraction B of the error current $I_{err}$. The mirror ratio of the correction current mirrors (83 and 84 in FIG. 2) is then scaled up by B so that the amplitude of the correction current $I_{crctn}$ has the same amplitude as the error current $I_{err}$ and is 180° out of phase with this current so that it is effectively canceled.

As shown by the preceding operational description, amplifier systems of the invention (20 in FIG. 1 and 20A in FIG. 2) approximate a constant output impedance and also approximate a constant quiescent output signal throughout the systems forward and reverse modes of operation. The constant quiescent output signal is obtained because the error-current canceler (28A in FIG. 2) cancels error currents that are generated as the signal amplifier (22A in FIG. 2) is turned on and off. If left on during active operational modes, the error-current canceler would degrade data signals at the output port (35A in FIG. 2). Accordingly, the timing diagram 100 of FIG. 4 shows that an error-current canceler enable signal $ES_{cc}$ 133 is present only during the presence of the reverse-amplifier enable signal $ES_{ra}$ 104.

The signal-amplifier disable signal $DS_{sa}$ 102 of FIG. 4 is initiated after the reverse amplifier has been enabled and is terminated prior to disabling of the reverse amplifier. Preferably, the signal-amplifier disable signal $DS_{sa}$ is gradually ramped on and-off as indicated by ramps 134 and 135 between times $T_2$ and $T_3$ and between times $T_4$ and $T_5$. This reduces the speed requirements at which the elements of the error-current canceler (28A in FIG. 2) must operate.

Although the error-current canceler enable signal $ES_{cc}$ is shown to be time-coincident with the reverse-amplifier enable signal $ES_{ra}$, it can be further limited to be present only when the signal-amplifier disable signal $DS_{sa}$ is changing state because that is when the error current ($I_{err}$ in FIG. 2) is generated. Accordingly, the error-current canceler enable signal $ES_{cc}$ can be limited as indicated by the broken-line signal 137 in FIG. 4.

Figure 6:
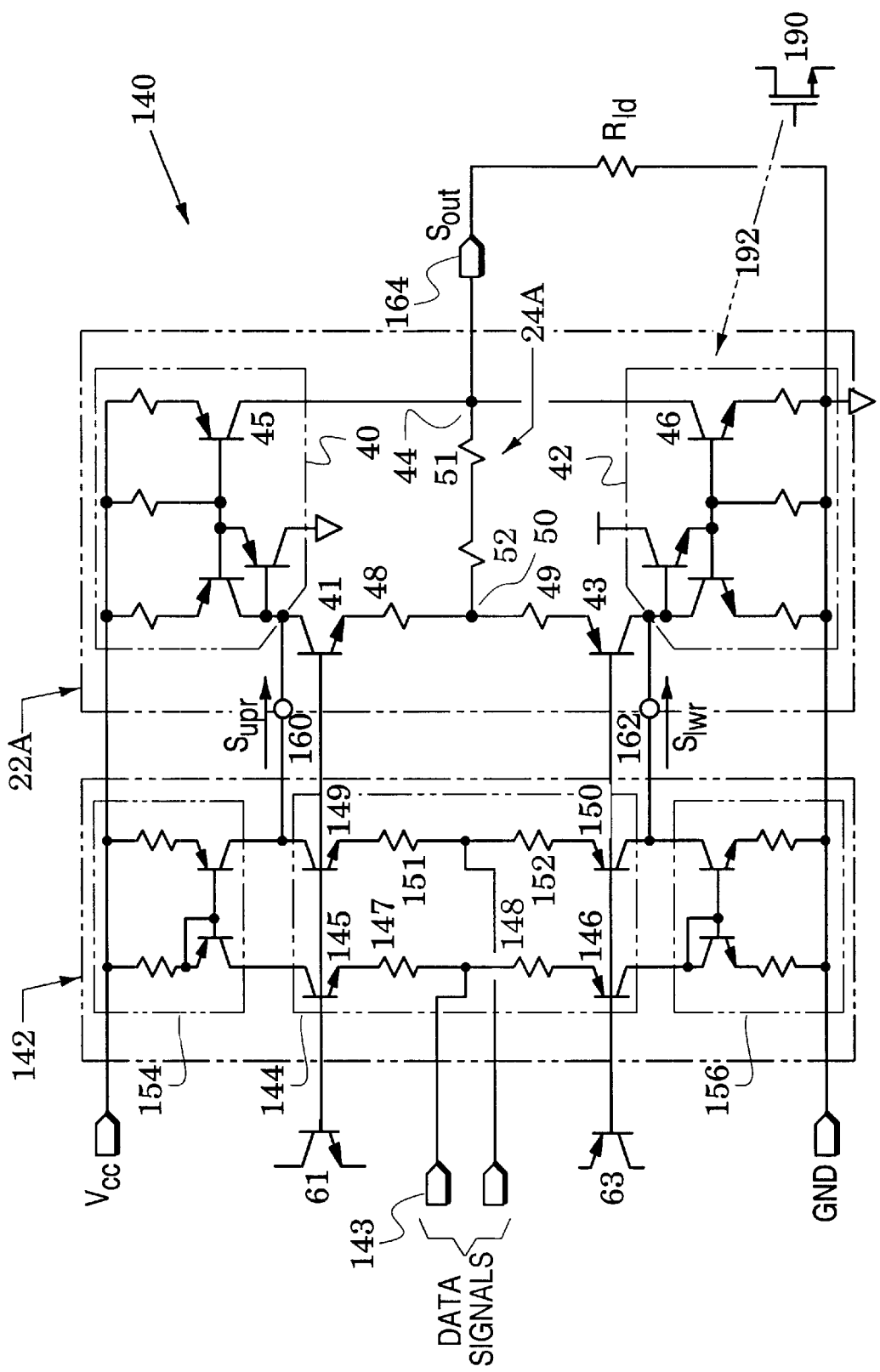
FIG. 6 is a schematic of another signal amplifier embodiment in the amplifier system of FIG. 2.

FIG. 6 illustrates another signal amplifier embodiment 140 which supplements the signal amplifier 22A of FIG. 2 with a current processor 142 that responds to the differential data signals at an input port 143 by providing in-phase upper and lower current signals $S_{upr}$ and $S_{lwr}$ that drive the upper and lower current mirrors 40 and 42. The current processor 142 also responds to a common-mode input current signal at the input port 143 by differentially altering respective amplitudes of the upper and lower current signals $S_{upr}$ and $S_{lwr}$ to thereby reduce harmonic distortion in the complementary output transistors 45 and 46.

A current generator 144 has cascode transistors 145 and 146 that are coupled by coupling resistors 147 and 148 and cascode transistors 149 and 150 that are coupled by coupling resistors 151 and 152. A 1:1 current mirror 154 is coupled between cascode transistors 145 and 149 and a 1:1 current mirror 156 is coupled between cascode transistors 146 and 150. The cascode transistors are biased by the base bias of bias transistors 61 and 63 of FIG. 2 which are also shown in FIG. 6.

In operation, differential data signals induce a first current in cascode transistor 149 and a opposite second current in cascode transistor 145 which is mirrored by current mirror 154 to combine at node 160. Accordingly, an upper current signal $S_{upr}$ is generated whose amplitude is twice that of the first and second currents. In a similar process, a lower current signal lower current signal $S_{lwr}$ is generated at node 162 that is in phase with the upper current signal $S_{upr}$ and these in-phase signals drive the signal amplifier 22A.

Because of this same mirroring action of current-mirrors 154 and 156, a common mode signal at the input port 143 generates current signals which cancel at the nodes 160 and 162 and do not directly affect the upper and lower current signals $S_{upr}$ and $S_{lwr}$. However, the common mode signal induces increased current flow in one of the current mirrors 154 and 156 and corresponding decreased current flow in the other. Impedance differences in cascode transistors 145, 146, 149 and 150 steer a portion of the differential data signals away from one of the current mirrors 154 and 156 and into the other.

Transistors in upper current mirror 40 of the signal amplifier 22A differ in polarity from transistors in the lower current mirror 42 and, therefore, they differ in their production of distortion signals when responding to like amplitude signals. The current processor 144 facilitates, therefore, a distortion reduction in the output data signal $S_{out}$ at an output port 164 because it can realize an appropriate amplitude difference between the upper and lower current signals $S_{upr}$ and $S_{lwr}$ in response to a corresponding change in the common mode signal that is applied at the input port 143.

Figure 7:
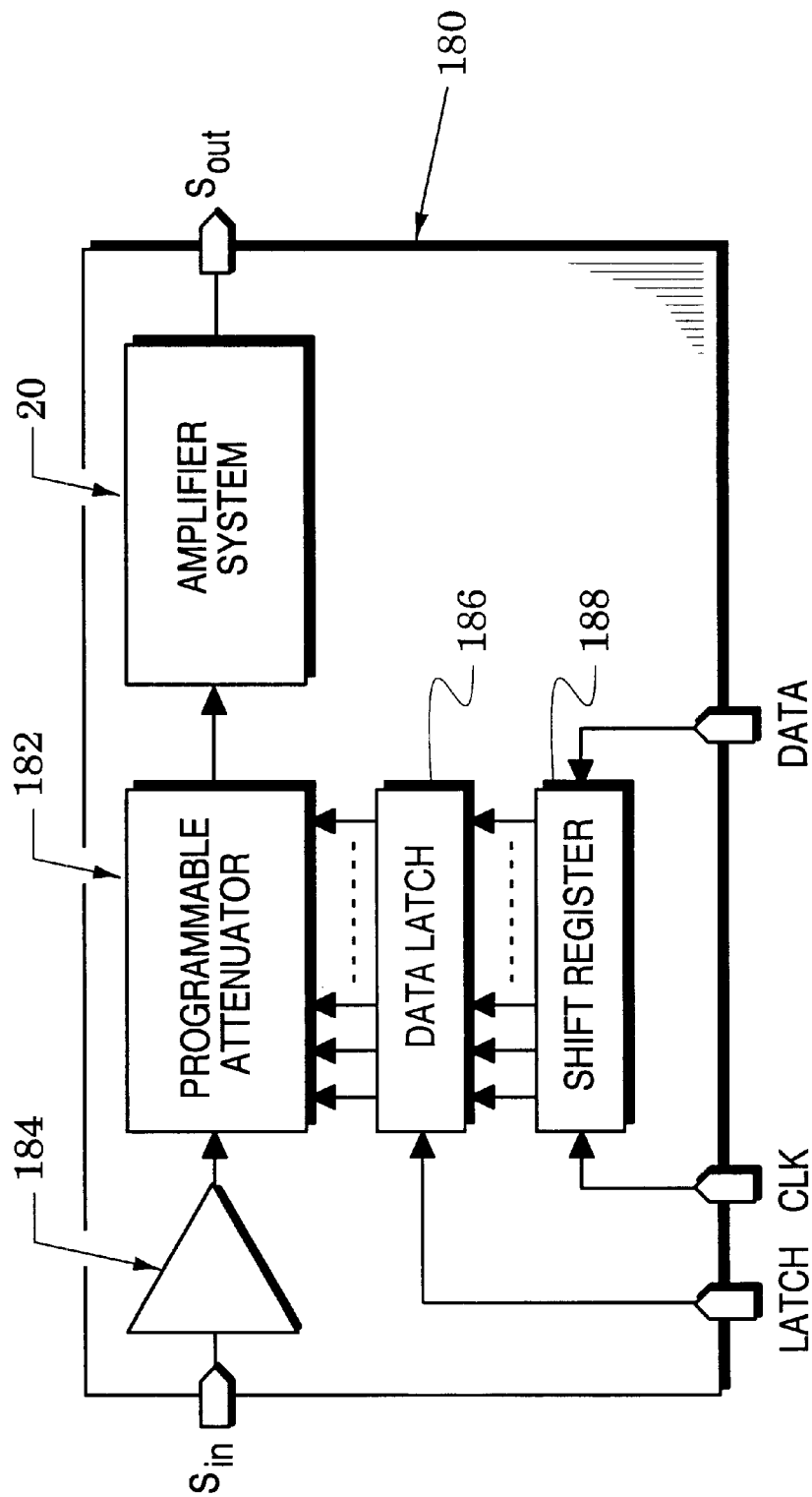
FIG. 7 is a block diagram of a programmable amplifier of the present invention that includes the amplifier system of FIG. 1.

FIG. 7 illustrates a programmable amplifier 180 that positions a programmable attenuator 182 between an input buffer amplifier 184 and the amplifier system 20 of FIG. 1. Attenuation of the programmable attenuator is set by a digital word that is applied from a data latch 186 which receives the digital word from a shift register 188 in response to a latch signal at a latch port. Words are applied to a data port of the shift register and clocked into the shift register in response to a clock signal applied to a clock port.

The buffer amplifier 184 provides gain, isolates the programmable attenuator 182 from input impedance changes and provides a low noise signal to the programmable attenuator. In response, the programmable attenuator provides, to the amplifier system, data signals that have been attenuated to a level commanded by the digital word that is provided from the latch 186. The amplifier system 20 then converts the data signals into output data signals in previously-described processes. The programmable amplifier 180 thus comprises a low-noise fixed amplifier, a digitally-controlled attenuator and a high-power amplifier which approximates a constant output impedance and a constant quiescent output signal during forward and reverse operational modes.

Although embodiments of the amplifier systems of the invention have been described with respect to bipolar transistors, other embodiments can be formed with different transistors (e.g., metal oxide transistors as exemplified in FIG. 6 by the metal oxide transistor 190 and the substitution arrow 192.

Signal amplifiers of the invention are generally structured as transimpedance amplifiers which generate a voltage signal across a load impedance in response to differential current signals. The terms "approximate" and "closely approximate" are used herein to describe parameters that are equal or closely approach equality. The term "quiescent" is used herein to describe signals when signal amplifiers of the invention are not transmitting data but may be switching between forward and reverse operational modes.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier system which approximates a constant output impedance during forward and reverse modes of operation, comprising:

a signal amplifier which has a signal-amplifier output impedance in an enable state and transitions from said enable state to a disable state in response to a signal-amplifier disable signal $DS_{sa}$;

a feedback path coupled to said signal amplifier to reduce said signal-amplifier output impedance to a substantially lower enable state output impedance $Z_{out_{enbl}}$;

a reverse amplifier which has a reverse-amplifier output impedance that reduces from an off output impedance to a substantially lower on output impedance as it transitions from an off state to an on state in response to a reverse-amplifier enable signal $ES_{ra}$ wherein said reverse amplifier is coupled to said feedback path to:
  a) interrupt said feedback path in said on state to thereby replace said enable state output impedance $Z_{out_{enbl}}$ with the substantially higher signal-amplifier output impedance; and
  b) realize a disable state output impedance $Z_{out_{dsbl}}$ that approximates said enable state output impedance $Z_{out_{enbl}}$;

and a signal generator which provides said signal-amplifier disable signal $DS_{sa}$ and said reverse-amplifier enable signal $ES_{ra}$ with said reverse-amplifier enable signal $ES_{ra}$ initiated before and terminated after said signal-amplifier disable signal $DS_{sa}$.

2. The amplifier system of claim 1, wherein said feedback path is coupled across at least part of said signal amplifier and said reverse amplifier is coupled to drive at least a portion of said feedback path.

3. The amplifier system of claim 1, wherein said feedback path comprises at least one resistor coupled across at least a portion of said signal amplifier.

4. The amplifier system of claim 3, wherein:

said signal amplifier has an output port;

said at least one resistor comprises first and second serially-connected resistors with said first resistor coupled to said output port; and said first resistor is selected to combine with said on output impedance to form said disable state output impedance $Z_{out_{dsbl}}$.

5. The amplifier system of claim 1, wherein said signal amplifier and said reverse amplifier are biased to generate substantially equal quiescent output signals to thereby reduce transient signals.

6. The amplifier system of claim 1, wherein said signal amplifier includes a complimentary output stage that provides said signal-amplifier output impedance.

7. The amplifier system of claim 6, wherein complimentary output stage is a complimentary common-emitter output stage.

8. The amplifier system of claim 1, wherein said signal amplifier is a transimpedance amplifier.

9. The amplifier system of claim 1, wherein said reverse amplifier includes a complimentary output stage that provides said reverse-amplifier output impedance.

10. The amplifier system of claim 9, wherein complimentary output stage is a complimentary common-collector output stage.

11. An amplifier system which approximates a constant output impedance and a constant quiescent output signal during forward and, reverse modes of operation, comprising:

a signal amplifier which has a signal-amplifier output impedance in an enable state and transitions from said enable state to a disable state in response to a signal-amplifier disable signal $DS_{sa}$;

a feedback path coupled to said signal amplifier to reduce said signal-amplifier output impedance to a substantially lower enable state output impedance $Z_{out_{enbl}}$;

a reverse amplifier which has a reverse-amplifier output impedance that reduces from an off output impedance to a substantially lower on output impedance as it transitions from an off state to an on state in response to a reverse-amplifier enable signal $ES_{ra}$ wherein said reverse amplifier is coupled to said feedback path to:
  a) interrupt said feedback path in said on state to thereby replace said enable state output impedance $Z_{out_{enbl}}$ with the substantially higher signal-amplifier output impedance; and
  b) provide a disable state output impedance $Z_{out_{dsbl}}$ that approximates said enable state output impedance $Z_{out_{enbl}}$;

a signal generator which provides said signal-amplifier disable signal $D_{sa}$ and said reverse-amplifier enable signal $ES_{ra}$ with said reverse-amplifier enable signal $ES_{ra}$ initiated before said signal-amplifier disable signal $DS_{sa}$ and terminated after said signal-amplifier disable signal $DS_{sa}$;

and an error-current canceler that includes:
  a) a current sensor that generates a sense signal in response to an output error current $I_{err}$ that is generated by said signal amplifier as it transitions between said enable and disable states; and
  b) a correction-current generator that cancels, in response to said sense signal, said output error current $I_{err}$ with a substantially equal and opposite correction current signal $I_{crctn}$.

12. The amplifier system of claim 11, wherein said signal amplifier includes a complimentary output stage that provides said signal-amplifier output impedance, said current sensor comprises a complementary sense stage that is coupled to said complimentary output stage to sense said output error current $I_{err}$ and generate said sense signal, and said correction-current generator comprises first and second current mirrors that; provide said correction current signal $I_{crctn}$ in response to said sense signal.

13. The amplifier system of claim 11, wherein said feedback path is coupled across at least part of said signal amplifier and said reverse amplifier is coupled to drive at least a portion of said feedback path.

14. The amplifier system of claim 13, wherein said correction-current generator includes a current steerer that steers said sense signal to said first and second current mirrors.

15. The amplifier system of claim 11, wherein said signal generator includes a clamp that disables at least one of said current sensor and said correction-current generator during said enable state.

16. The amplifier system of claim 11, wherein said signal amplifier and said reverse amplifier are biased to generate substantially equal quiescent output signals.

17. The amplifier system of claim 11, wherein said signal amplifier includes a complimentary output stage that provides said signal-amplifier output impedance.

18. The amplifier system of claim 11, wherein:

said signal amplifier has an output port;

said feedback path comprises first and second serially-connected resistors with said first resistor coupled to said output port;

and said first resistor is selected to combine with said on output impedance to form said disable state output impedance $Z_{out_{dsbl}}$.

19. The amplifier system of claim 11, wherein said signal generator is configured to gradually initiate and terminate said signal-amplifier disable signal $D_{sa}$.

20. A method for approximating a constant output impedance and a constant quiescent output signal during forward and reverse modes of operation of an amplifier system, comprising the steps of:

provide a signal amplifier which has a signal-amplifier output impedance in an enable state and transitions from said enable state to a disable state in response to a signal-amplifier disable signal $D_{sa}$;

coupling a feedback path to said signal amplifier to reduce said signal-amplifier output impedance to a substantially lower enable state output impedance $Z_{out_{enbl}}$;

driving said feedback path with a reverse amplifier which has a reverse-amplifier output impedance that reduces from an off output impedance to a substantially lower on output impedance as it transitions from an off state to an on state in response to a reverse-amplifier enable signal $ES_{ra}$, said reverse amplifier thus:

a) interrupting said feedback path in said on state and replacing said enable state output impedance $Z_{out_{enbl}}$ with the substantially higher signal-amplifier output impedance; and b) providing a disable state output impedance $Z_{out_{dsbl}}$ that approximates said enable state output impedance $Z_{out_{enbl}}$;

and providing said signal-amplifier disable signal $D_{sa}$ and said reverse-amplifier enable signal $ES_{ra}$ with said reverse-amplifier enable signal $ES_{ra}$ initiated before said signal-amplifier disable signal $DS_{sa}$ and terminated after said signal-amplifier disable signal $DS_{sa}$.

21. The method of claim 20, further including the steps of:

generating a sense signal in response to an output error current $I_{err}$ that is generated by said signal amplifier as it transitions between said enable and disable states; and in response to said sense signal, cancelling said output error current $I_{err}$ with a substantially equal and opposite correction current signal $I_{crctn}$.

22. The method of claim 20, further including the step of biasing said signal amplifier and said reverse amplifier to generate substantially equal quiescent output signals and thereby further reducing said transient signals.

23. The method of claim 20, wherein said coupling step includes the step of forming said feedback path with at least one resistor.

24. The method of claim 20, wherein said providing step includes the step of gradually initiating and terminating said signal-amplifier disable signal $D_{sa}$.

25. A variable-gain amplifier that generates a programmable output signal in response to an input signal, comprising:

a programmable attenuator that converts said input signal to a differential input current signal with a programmable amplitude; and an amplifier system which provides said output signal in response to said differential input current signal and which approximates a constant output impedance during forward and reverse modes of operation;

wherein said amplifier system includes:

a signal amplifier which has a signal-amplifier output impedance in an enable state and transitions from said enable state to a disable state in response to a signal-amplifier disable signal $DS_{sa}$;

a feedback path coupled to said signal amplifier to reduce said signal-amplifier output impedance to a substantially lower enable state output impedance $Z_{out_{enbl}}$;

a reverse amplifier which has a reverse-amplifier output impedance that reduces from an off output impedance to a substantially lower on output impedance as it transitions from an off state to an on state in response to a reverse-amplifier enable signal $ES_{ra}$ wherein said reverse amplifier is coupled to said feedback path to:

a) interrupt said feedback path in said on state to thereby replace said enable state output impedance $Z_{out_{enbl}}$ with the substantially higher signal-amplifier output impedance;

and b) realize a disable state output impedance $Z_{out_{dsbl}}$ that approximates said enable state output impedance $Z_{out_{enbl}}$;

and a signal generator which provides said signal-amplifier disable signal $DS_{sa}$ and said reverse-amplifier enable signal $ES_{ra}$ with said reverse-amplifier enable signal $ES_{ra}$ initiated before and terminated after said signal-amplifier disable signal $DS_{sa}$.

26. The amplifier of claim 25, wherein said amplifier system further comprises an error-current canceler that includes:

a current sensor that generates a sense signal in response to an output error current $I_{err}$ that is generated by said signal amplifier as it transitions between said enable and disable states; and a correction-current generator that cancels in response to said sense signal, said output error current $I_{err}$ with a substantially equal and opposite correction current signal $I^{crctn}$.

27. The amplifier of claim 25, wherein said programmable attenuator adjusts its attenuation in response to a digital signal and further including:

a data register that receives said digital word; and a data latch that presents said digital word to said programmable attenuator.

28. The amplifier of claim 27, further including a buffer amplifier that precedes said programmable attenuator.

* * * * *